(12) United States Patent
Onitsuka et al.

(10) Patent No.: US 12,177,983 B2
(45) Date of Patent: Dec. 24, 2024

(54) ELECTRONIC COMPONENT HOUSING PACKAGE, ELECTRONIC DEVICE, AND ELECTRONIC MODULE

(71) Applicant: KYOCERA Corporation, Kyoto (JP)

(72) Inventors: Yoshitomo Onitsuka, Akune (JP); Keisuke Sawada, Satsumasendai (JP)

(73) Assignee: KYOCERA Corporation, Kyoto (JP)

( * ) Notice: Subject to any disclaimer, the term of this patent is extended or adjusted under 35 U.S.C. 154(b) by 33 days.

(21) Appl. No.: 17/779,892

(22) PCT Filed: Nov. 16, 2020

(86) PCT No.: PCT/JP2020/042619
§ 371 (c)(1),
(2) Date: May 25, 2022

(87) PCT Pub. No.: WO2021/106655
PCT Pub. Date: Jun. 3, 2021

(65) Prior Publication Data
US 2023/0007777 A1   Jan. 5, 2023

(30) Foreign Application Priority Data

Nov. 26, 2019   (JP) .................................. 2019-213312

(51) Int. Cl.
*H05K 1/18* (2006.01)
*H05K 1/03* (2006.01)

(52) U.S. Cl.
CPC ........... *H05K 1/185* (2013.01); *H05K 1/0306* (2013.01); *H05K 2201/09272* (2013.01); *H05K 2201/10075* (2013.01)

(58) Field of Classification Search
CPC .......... H05K 1/18; H05K 1/03; H05K 1/0306; H05K 1/185; H05K 2201/09272; H05K 2201/10075
USPC ......................................................... 174/250
See application file for complete search history.

(56) References Cited

U.S. PATENT DOCUMENTS

| | | |
|---|---|---|
| 2018/0324953 A1 | 11/2018 | Onitsuka |
| 2019/0043770 A1 | 2/2019 | Kisaki et al. |
| 2019/0333831 A1 | 10/2019 | Kisaki et al. |

FOREIGN PATENT DOCUMENTS

| | | |
|---|---|---|
| CN | 108781502 A | 11/2018 |
| JP | 2005-050935 A | 2/2005 |
| WO | 2017/126596 A1 | 7/2017 |

*Primary Examiner* — Tremesha W Burns
(74) *Attorney, Agent, or Firm* — Volpe Koenig

(57) ABSTRACT

An electronic component housing package includes an insulating substrate including a first surface with a mounting region mounting an electronic component, a second surface located opposite to the first surface, a plurality of side surfaces located between the first surface and the second surface, and a corner portion located between two of the side surfaces; an external connection conductor located on the second surface; and a corner conductor connected to the external connection conductor. The corner conductor is located from the external connection conductor toward the corner portion in a manner to increase the distance from the second surface.

18 Claims, 9 Drawing Sheets

ELECTRONIC COMPONENT HOUSING PACKAGE, ELECTRONIC DEVICE, AND ELECTRONIC MODULE

TECHNICAL FIELD

The present disclosure relates to an electronic component housing package, or the like, which is configured to house an electronic component such as a piezoelectric oscillating element.

BACKGROUND ART

In the related art, as an electronic component housing package for mounting an electronic component such as a piezoelectric oscillating element or a semiconductor element, a package in which a recessed mounting portion for housing the electronic component is provided in an insulating substrate, is used. A lid is joined to the upper surface of the insulating substrate so as to close the mounting portion. Such an electronic component housing package includes:
 an insulating substrate including:
  a flat plate shaped base portion including an electronic component mounting portion on an upper surface thereof; and
  a frame-shaped frame portion layered on the upper surface of the base portion so as to surround the mounting portion; and
 wiring conductors located from the mounting portion to the lower surface of the base portion.

In recent years, individual wiring boards have become increasingly small, and when such small wiring boards are manufactured, there is a known method in which a boundary dividing groove is provided to divide adjacent wiring board regions (each region to be an electronic component housing package) arranged on a mother board. Further, a method of providing the dividing groove by a laser having excellent positional accuracy has been proposed (see JP 2005-50935 A).

SUMMARY

An electronic component housing package of the present disclosure includes an insulating substrate including a first surface with a mounting region mounting an electronic component, a second surface located opposite to the first surface, a plurality of side surfaces located between the first surface and the second surface, and a corner portion located between two of the side surfaces; an external connection conductor located on the second surface; and a corner conductor connected to the external connection conductor. The corner conductor is located from the external connection conductor toward the corner portion between two of the side surfaces of the insulating substrate in a manner to increase the distance from the second surface.

An electronic device of the present disclosure includes the electronic component housing package described above and an electronic component mounted in the electronic component housing package.

An electronic module of the present disclosure includes the electronic device described above and a module substrate connected to the electronic device.

DETAILED DESCRIPTION

Figure 1:
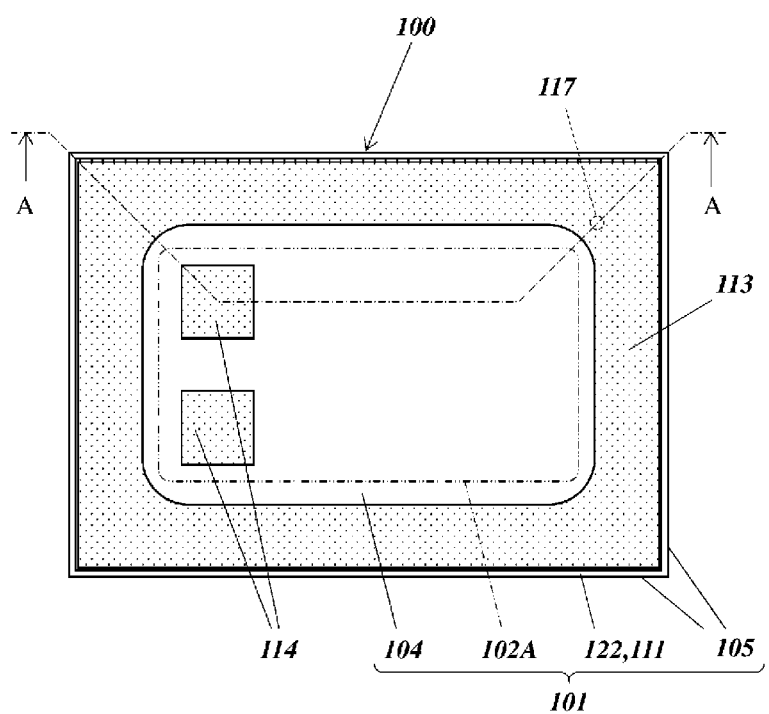
FIG. 1 is a top view illustrating an electronic component housing package according to an embodiment of the present disclosure.
Figure 2:
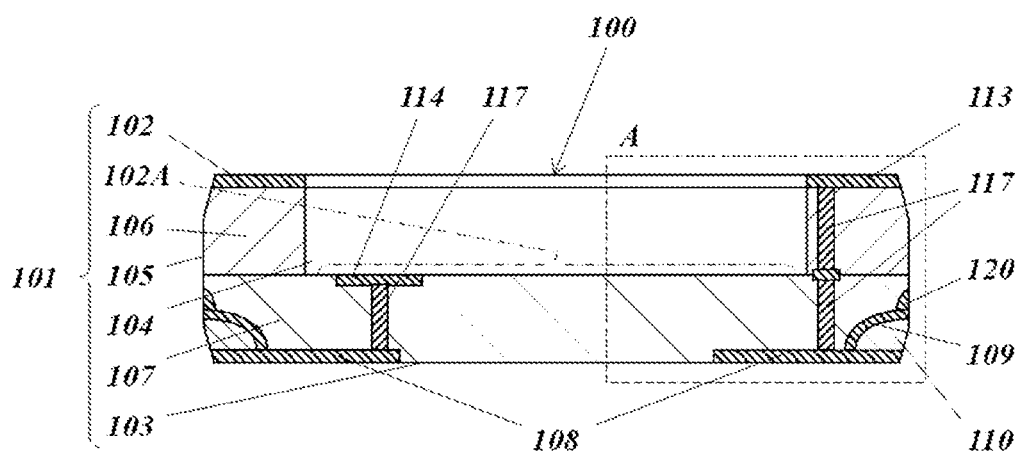
FIG. 2 is a cross-sectional view taken along a line A-A in FIG. 1.
Figure 3:
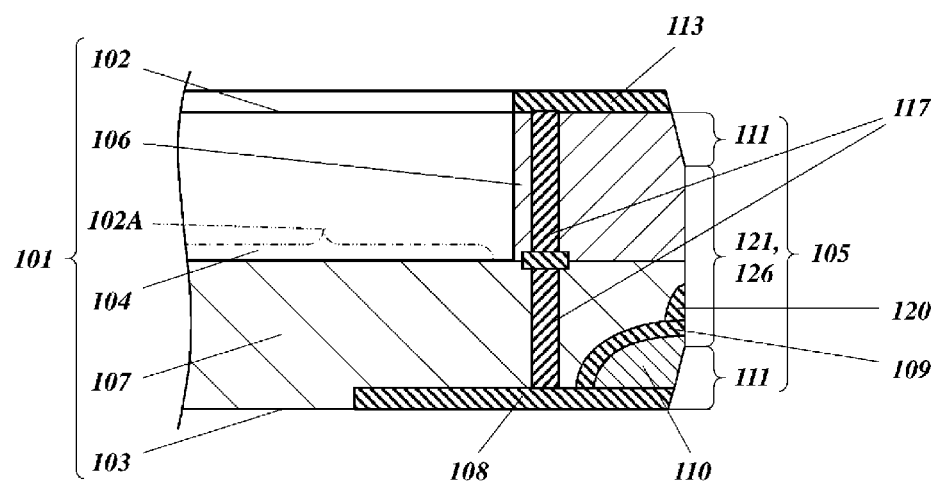
FIG. 3 is a cross-sectional view illustrating a main part of an electronic component housing package according to an embodiment of the present disclosure.
Figure 4:
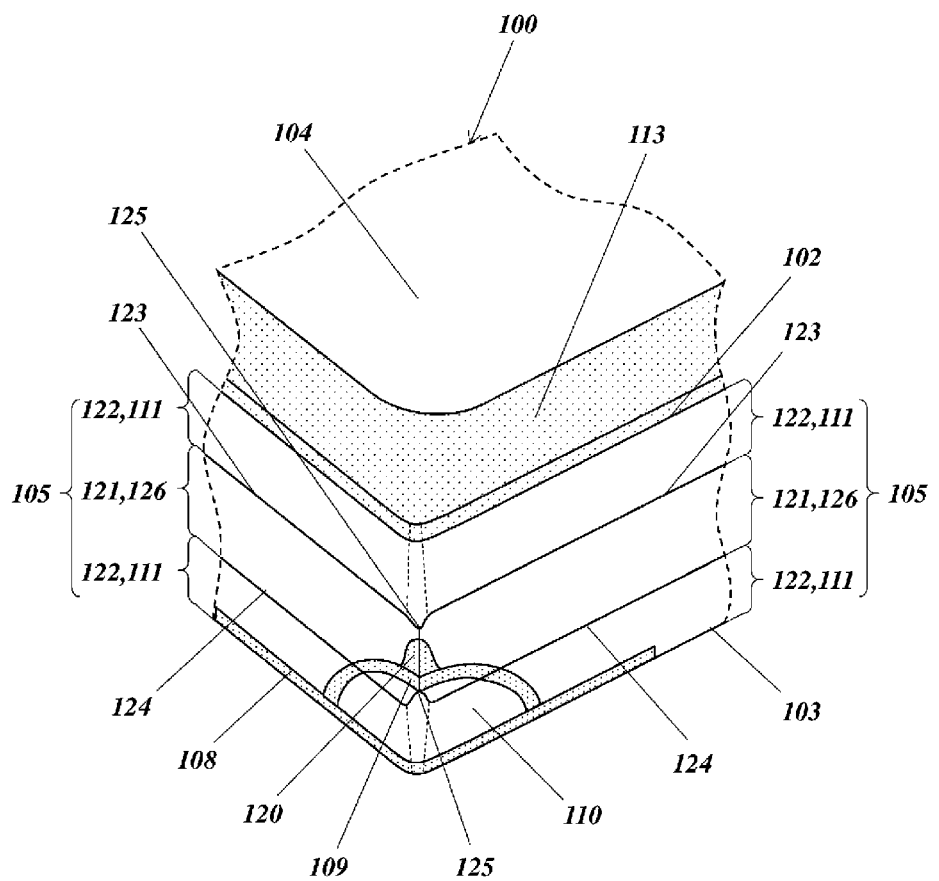
FIG. 4 is a perspective view illustrating a main part of an electronic component housing package according to an embodiment of the present disclosure.
Figure 5:
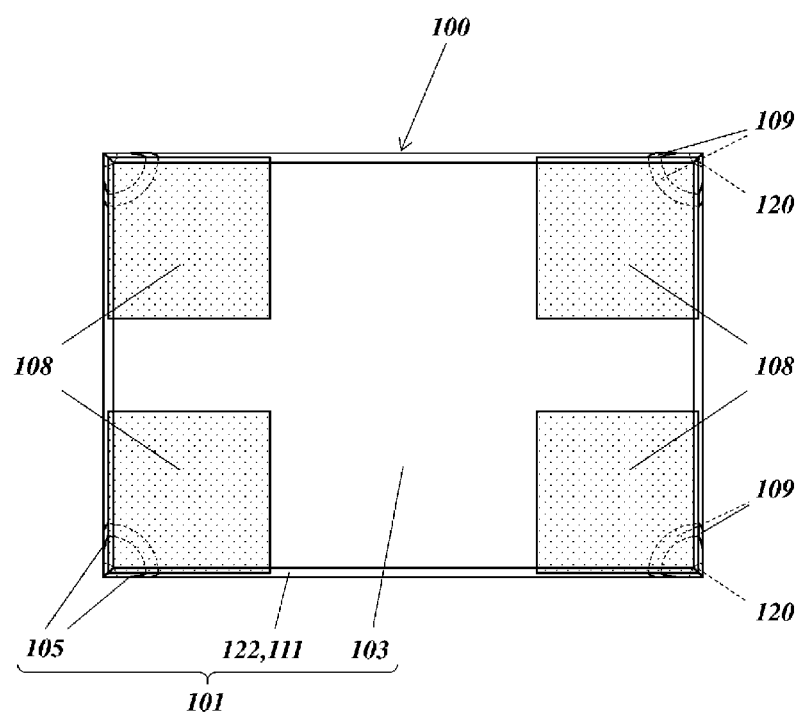
FIG. 5 is a bottom view illustrating an electronic component housing package according to an embodiment of the present disclosure.
Figure 6:
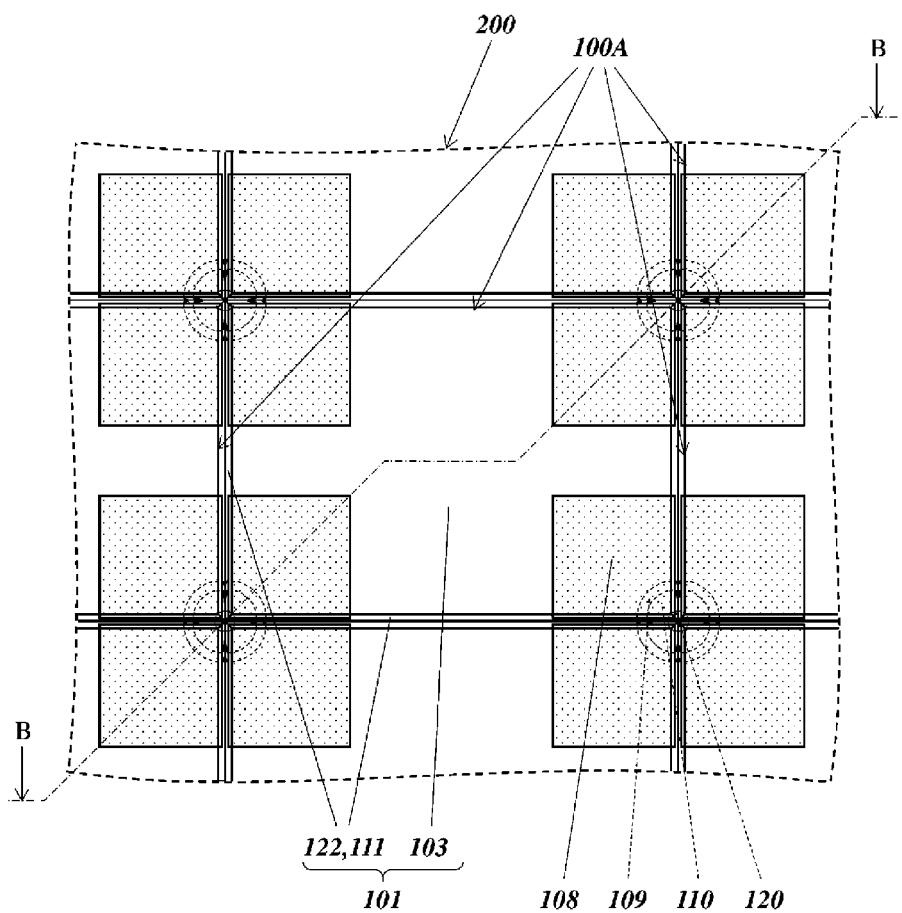
FIG. 6 is a bottom view illustrating a multipiece wiring board when manufacturing an electronic component housing package according to an embodiment of the present disclosure.
Figure 7:
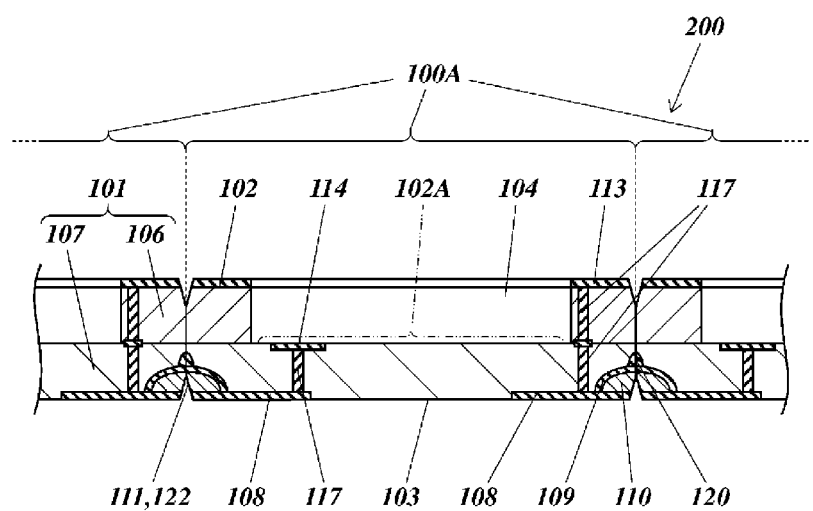
FIG. 7 is a cross-sectional view taken along a line B-B in FIG. 6.
Figure 8:
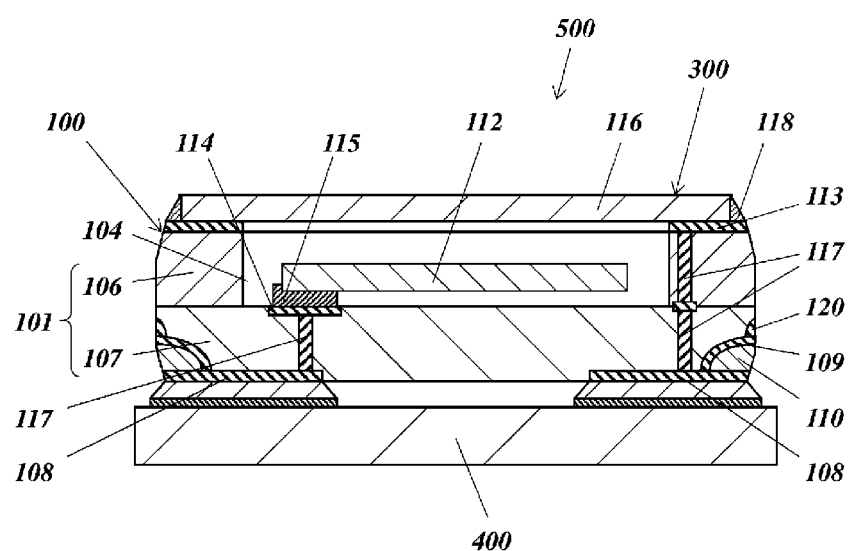
FIG. 8 is a cross-sectional view illustrating an electronic device and an electronic module according to an embodiment of the present disclosure.
Figure 9:
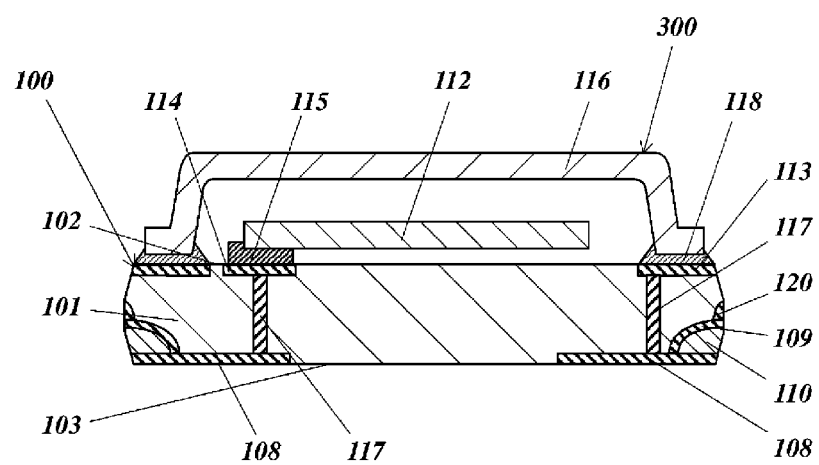
FIG. 9 is a cross-sectional view illustrating another example of an electronic component housing package and an electronic device according to an embodiment of the present disclosure.

An electronic component housing package 100 (hereinafter also referred to as a wiring board) of the present disclosure will be described with reference to the accompanying drawings. FIG. 1 is a top view illustrating an example of an embodiment of the electronic component housing package 100 of the present disclosure, and FIG. 2 is a cross-sectional view taken along a line A-A in FIG. 1. FIG. 3 is a cross-sectional view illustrating a main part of the electronic component housing package 100 according to an embodiment of the present disclosure, and a part A in FIG. 2 is enlarged. FIG. 4 is a perspective view illustrating a main part of the electronic component housing package 100 in FIG. 1. FIG. 5 is a bottom view illustrating the electronic component housing package 100 in FIG. 1. FIG. 6 is a bottom view illustrating a part of a multipiece wiring board (mother board 200) when manufacturing the electronic component housing package 100 according to an embodiment of the present disclosure FIG. 7 is a cross-sectional view taken along a line B-B of the mother board 200 in FIG. 6. FIG. 8 is a cross-sectional view illustrating an electronic device 300 and an electronic module 500 according to an embodiment of the present disclosure, and illustrates an example in which an electronic component 112 is mounted in the electronic component housing package 100 illustrated in FIGS. 1 to 5 and sealed with a lid 116. FIG. 9 is a cross-sectional view illustrating an electronic device 300 using another example of the electronic component housing package 100 according to an embodiment of the present disclosure. Although the vertical direction is described with a first surface 102 of an insulating substrate 101 of the electronic component housing package 100 as an upper surface and a second surface 103 as a lower surface, this vertical direction does not necessarily coincide with the vertical direction when the electronic component housing package 100 or the like is used. In FIGS. 1, 4, 5 and 6, conductors such as an external connection conductor 108 are filled with dot patterns so as to be easily distinguished from other members.

In FIGS. 1 to 5, the electronic component housing package 100 includes a first surface 102 as a sealing surface side, a second surface 103 as a mounting surface side toward the module substrate 400, and a cavity 104 located at the first surface 102, and a mounting region 102A is located at the bottom of the cavity 104. An electronic component 112 such as a piezoelectric oscillating element is mounted on the mounting region 102A. As illustrated in FIG. 1, in this wiring board example, a frame-shaped metallization layer 113 is located on the outer edge of the first surface 102 of the insulating substrate 101, and a pair of connection pads 114 to which the electronic component 112 is connected, are located in the mounting region 102A located inside the frame-shaped metallization layer 113. The electronic component 112 is connected to the connection pad 114 and the lid 116 is joined to the frame-shaped metallization layer 113 of the insulating substrate 101 by a brazing material 118 such as a gold tin alloy to hermetically seal the electronic component 112.

In the example illustrated in FIGS. 1 to 5, the insulating substrate 101 includes an upper insulating layer 106 and a lower insulating layer 107 layered on each other. In the insulating substrate 101, the frame-shaped upper insulating layer 106 including an opening corresponding to the cavity 104 is layered on the lower insulating layer 107 with a flat plate shape. In plan view, the upper insulating layer 106 surrounds the mounting region 102A on the upper surface of the lower insulating layer 107. The inner side surface of the upper insulating layer 106 and the lower insulating layer 107 exposed inside the mounting region 102A include a cavity 104 that is recessed and that includes the mounting region 102A for mounting the electronic component 112. By housing the electronic component 112 in the cavity 104, the electronic component 112 is protected by being surrounded by the upper insulating layer 106 and the lower insulating layer 107. Further, the electronic component 112 is hermetically sealed by a lid 116 closing the opening of the cavity 104. The lid 116 at this time can be a flat plate.

The frame-shaped metallization layer 113 is located on the first surface 102 (the upper surface of the upper insulating layer 106) of the insulating substrate 101, and a through-hole conductor 117 is located inside the upper insulating layer 106, for example, from the upper surface to the lower surface. A through-hole conductor 117 is also located inside the lower insulating layer 107 so as to be located directly below the through-hole conductor 117 located inside the upper insulating layer 106. In this example, the through-hole conductor 117 is located at the corner portion of the frame-shaped metallization layer 113 of the insulating substrate 101, but a strip-shaped wiring conductor may be located on the outside surface of the insulating substrate 101 or the inner side surface of the cavity 104, for example, as a conduction path.

The through-hole conductor 117 of the upper insulating layer 106 and the through-hole conductor 117 of the lower insulating layer 107 overlap in plane perspective and are electrically connected to each other. In consideration of electrical connectivity due to layer misalignment or the like, a relay conductor (no reference sign) may be positioned between the upper insulating layer 106 and the lower insulating layer 107, as an example illustrated in FIG. 2. Then, conduction is made from the frame-shaped metallization layer 113 to the through-hole conductor 117 of the upper insulating layer 106, the relay conductor, and the through-hole conductor 117 of the lower insulating layer 107, and the through-hole conductor 117 of the lower insulating layer 107 is connected to the external connection conductor 108 located on the second surface 103. Then, conduction is achieved from the frame-shaped metallization layer 113 to the through-hole conductor 117, the relay conductor, and the external connection conductor 108. The lid 116 made of a conductive material such as metal is joined to the frame-shaped metallization layer 113 by a conductive joining material such as a brazing material 118, and the external connection conductor 108 electrically connected to the frame-shaped metallization layer 113 is connected to the ground potential, so that the lid 116 can function as a shield against electromagnetic noise.

In the lower insulating layer 107, as a conduction path for electrically connecting the mounted electronic component 112 and the external electrical circuit of the module substrate 400, a connection pad 114 is located in the mounting region 102A and, furthermore, a through-hole conductor 117 and a relay conductor are located in the mounting region 102A. The external connection conductor 108 is located on the bottom surface (second surface 103) of the lower insulating layer 107.

The electronic component housing package 100 is, for example, as illustrated in FIGS. 6 and 7, manufactured as a multipiece wiring board (mother board 200) in which wiring board regions 100A, each of which is to be an individual electronic component housing package 100, are arranged, and subsequently divided into individual pieces. The mother board 200 includes a flat insulating layer including a plurality of regions to be the lower insulating layers 107 layered on each other and an insulating layer including a plurality of regions to be the upper insulating layers 106. In these insulating layers, each of regions, which become the upper insulating layers 106, includes an opening to be a cavity 104. Hereinafter, the term "upper insulating layer 106" and "lower insulating layer 107" are also used in the mother board 200.

The insulating substrate 101 (the upper insulating layer 106 and the lower insulating layer 107) is composed of a ceramic material such as an aluminum oxide-based sintered body, an aluminum nitride sintered body, a mullite-based sintered body, or a glass-ceramic sintered body. The insulating substrate 101 has, for example, a rectangular shape having a side length of about 1.2 to 10 mm in plan view, a plate shape having a thickness of about 0.3 to 2 mm, and the cavity 104 has a rectangular shape having a side length of about 1 to 9 mm in plan view, and a depth of about 0.1 to 1.5 mm.

The insulating substrate 101 can be produced as follows when the upper insulating layer 106 and the lower insulating layer 107 are made of an aluminum oxide-based sintered body. First, a plurality of ceramic green sheets are produced by adding and mixing an appropriate organic binder, solvent, plasticizer, or the like, to raw material powders such as aluminum oxide, silicon oxide, magnesium oxide, and calcium oxide to form a slurry, and forming the slurry into a sheet by, for example, a sheet forming method such as a doctor blade method or a roll calender method. Next, a part of the ceramic green sheet is formed into a frame shape by appropriate punching processing, and a laminate is produced by vertically layering the ceramic green sheet having a frame shape on the upper surface of the ceramic green sheet having a flat plate shape. The laminate can be produced, for example, by firing at 1200° C. to 1600° C. The above description of the manufacturing method of the insulating substrate 101 is given by focusing on a portion of one wiring board region 100A in the multipiece board (mother board 200), in other words, an explanation in the case where there are no multiple pieces. In the manufacturing method to be described later, the same explanation may be given.

Further, a nickel plating layer and a gold plating layer may be sequentially deposited on each conductor such as the connection pad 114 exposed on the surface of the electronic component housing package 100 in order to prevent oxidation corrosion and to facilitate connection with the electronic component 112 and connection with the module substrate 400 by soldering or the like.

In the case where the electronic device 300 includes a plurality of electronic components 112 mounted in the mounting region 102A, the upper insulating layer 106 to be a frame portion may be composed of two or more insulating layers in order to provide a stepped inner side surface in which the plurality of electronic components are mounted.

The mounting region 102A is rectangular in plan view in accordance with, for example, a rectangular plate-shaped electronic component 112. In FIG. 1, the mounting region 102A is illustrated virtually as a two dot chain line. Here, the "rectangular" shape means that it includes not only a rectangle in the strict sense but also a rectangle with rounded corners. In the example in FIG. 1, a pair of connection pads 114 are located at two corners respectively located at both ends of one short side of the rectangular mounting region 102A. The connection pad 114 functions as a conductor layer for connecting an electrode (not illustrated) of an electronic component 112 such as a piezoelectric oscillating element to be mounted on the mounting region 102A. When the electronic component 112 is a piezoelectric oscillating element, the outer shape thereof is generally rectangular in plan view, and a pair of electrodes (not illustrated) for connection are provided at corners of the surface thereof. To facilitate and ensure the connection of such electrodes, the connection pads 114 are biased toward the corners of the mounting region 102A.

The number and arrangement of the connection pads 114 described above describe an example in which the piezoelectric oscillating element described above is used as the electronic component 112. The number and arrangement of the connection pads 114 can be set depending on the number and arrangement of electrodes of the mounted electronic component 112 and the number of mounted electronic components 112.

While the above is the basic configuration of the electronic component housing package 100, the electronic component housing package 100 of the present disclosure further includes a corner conductor 109. That is, the electronic component housing package 100 of the present disclosure includes an insulating substrate 101 including a first surface 102 with a mounting region 102A mounting an electronic component 112, a second surface 103 located opposite to the first surface 102, a plurality of side surfaces 105 located between the first surface 102 and the second surface 103, and a corner portion located between two of the side surfaces 105; an external connection conductor 108 located on the second surface 103; and the corner conductor 109 connected to the external connection conductor 108. The corner conductor 109 is located in a manner to increase the distance from the second surface 103 as advancing from the external connection conductor 108 toward the corner portion between the two side surfaces 105 of the insulating substrate 101.

In recent years, electronic component housing packages have become increasingly small, and as a result, the area of the external connection conductor located on the lower surface of the electronic component housing package has become increasingly small. Therefore, when an electronic device is connected to the module substrate by a joining material such as solder, there is a possibility that the joining strength between the insulating substrate and the external connection conductor may be reduced. In the electronic component housing package with such marked size reduction, there is a possibility that the joining strength between the insulating substrate and the external connection conductor may be lowered, especially at the end portion on the lower surface side of the corner portion between the two side surfaces of the insulating substrate.

According to the electronic component housing package 100 of the present disclosure, the strength of the insulating substrate 101 can be increased to reduce the likelihood of chipping and cracking. This is because when the electronic component housing package 100 (electronic device 300) is mounted on the module substrate 400, the end portion (corner portion formed by the two side surfaces 105 and the second surface 103) on the second surface 103 side of the corner portion between the side surface 105 of the insulating substrate 101, which is most susceptible to stress, is sandwiched between the external connection conductor 108 and the corner conductor 109 and protected. Since the likelihood of chipping or cracking of the corner portion of the insulating substrate 101 is reduced, peeling of the external connection conductor 108 from the insulating substrate 101 is suppressed, and the joining strength between the insulating substrate 101 and the external connection conductor 108 is high.

The corner conductor 109 is located such that the distance from the second surface 103 gradually increases as advancing from the second surface 103 around the corner portion of the insulating substrate 101 toward the corner portion of the insulating substrate 101. Further, the corner conductor 109 may be a fan shape that is ¼ of a circle in plane perspective. "fan shape" refers to not only a complete fan, but also one in which the arc portion of the fan is not a complete arc, and the lengths of the two radial portions extending from the central angle are not exactly the same. The shape of the external connection conductor 108 in plan view may be rectangular, such as square, located at the corner portion of the rectangular second surface 103, where two adjacent sides of the external connection conductor 108 overlap with the two sides of the second surface 103. The corner conductor 109 may overlap with one corner section of the external connection conductor 108 in plane perspective, the central angle of the sector of the corner conductor 109 overlaps with one corner of the second surface 103 and one corner of the external connection conductor 108, and the radial portion extending from the central angle of the sector overlaps with the two sides of the external connection conductor 108 located across the one corner. When the electronic component housing package 100 is viewed in side view, the shape of the corner conductor 109 exposed to the side surface 105 of the insulating substrate 101 is an arc shape. The shape of the corner conductor 109 is an arc shape, which is formed, in one side surface 105, around the corner between the other side surface 105 and the second surface 103. This arc can be a perfect circle arc as well as an elliptical arc as in the example illustrated in FIG. 3. Additionally, the connection portion between the external connection conductor 108 and the corner conductor 109 has a convex arc shape toward the center (inside) of the second surface 103 in plane perspective. The corner conductor 109 extends from the arc-shaped connection portion to a point at the corner portion in a convex arc shape toward the first surface 102 in a manner to increase the distance from the second surface 103 (distance from the external connection conductor 108). That is, the three-dimensional shape of the corner conductor 109 is a shape in which the hemispherical shape (dome shape) is reduced to ¼, a ¼ dome shape. It is ¼ dome-shaped extending from an arc on the external connection conductor 108 to a point at the corner portion. Because of this shape of the corner conductor 109, the corner of the insulating substrate 101 between the second surface 103 and the two side surfaces 105 is sandwiched (surrounded) between the external connection conductor 108 and the corner conductor 109.

Additionally, an insulator 110 sandwiched between the external connection conductor 108 and the corner conductor 109 and located at the corner portion of the insulating substrate 101 on the second surface 103 side is provided. In FIGS. 2 and 3, a region sandwiched between the external connection conductor 108 and the corner conductor 109 at the corner portion on the second surface 103 side of the insulating substrate 101 is illustrated as the insulator 110 with hatching different from that of the upper insulating layer 106 and the lower insulating layer 107. The insulator 110 is sandwiched and protected between the external connection conductor 108 and the corner conductor 109. Since the insulator 110 is surrounded by the external connection conductor 108 and the corner conductor 109, which are mainly composed of a metal having elasticity higher than that of the ceramics of the insulating substrate 101 and easily absorb stress, even when stress is applied to the electronic component housing package 100, the insulator 110 located at this corner is not prone to chipping and cracking. Furthermore, even when cracks and chips are generated at the corner portion of the insulating substrate 101, the cracks and chips tend to remain within a range sandwiched between the external connection conductor 108 and the corner conductor 109. Therefore, the likelihood of disconnection of the conduction path such as the through-hole conductor 117 due to the breaking of the insulating substrate 101 is reduced, and since the electrical connection between the module substrate 400 and the external connection conductor 108 is maintained, the connection reliability is excellent.

To obtain an electronic component housing package 100 including such a corner conductor 109, the following method can be used. For example, in a ceramic green sheet for the upper insulating layer 106, an opening to be the cavity 104 is formed by punching or the like, and a metallization paste to be the frame-shaped metallization layer 113 and the through-hole conductor 117 or the like, is positioned at predetermined places. The metallization paste to be the through-hole conductor 117 can be filled in a through hole formed at a predetermined position of the ceramic green sheet by punching or the like. In a ceramic green sheet to be a lower insulating layer 107, a metallization paste to be the connection pad 114, the external connection conductor 108, the corner conductor 109, and the through-hole conductor 117 or the like, is positioned at predetermined places. Then, after the ceramic paste to be the insulator 110 is positioned at a predetermined place in a manner to cover the upper surface of the metallization paste to be the corner conductor 109, the ceramic green sheet provided with the metallization paste and the ceramic paste at the predetermined position may be pressure processed. The metallization paste to be the external connection conductor 108 overlaps the ceramic paste to be the insulator 110. A ceramic paste to be the insulator 110 is provided on the metallization paste to be a part of the external connection conductor 108 (a part inside the corner conductor 109) and the corner conductor 109, and a metallization paste to be the remaining part of the external connection conductor 108 (a part overlapping with the corner conductor 109) is provided on the ceramic paste, and pressure processing is performed. Alternatively, a ceramic paste to be the insulator 110 may be provided on a metallization paste to be the corner conductor 109, and a metallization paste to be the external connection conductor 108 may be provided on the ceramic paste to perform pressure processing. The ceramic green sheet for the upper insulating layer 106 and the ceramic green sheet for the lower insulating layer 107 thus processed are layered and the laminate is fired to produce the electronic component housing package 100.

The ceramic paste to be the insulator 110 may be substantially made of the same material as the ceramic green sheet. "The same material" refers to a material that contains the same ceramic components as the upper insulating layer 106 and the lower insulating layer 107 after firing, and the amount of binder and solvent added to the ceramic paste is adjusted according to the specification of the coating method (e.g., screen printing, or the like). Then, as illustrated in FIG. 5, for example, the ceramic paste (to be the insulator 110) may be applied in a fan shape (circular on mother board 200) of ¼ of a circle and positioned so that the thickness thereof is greatest at the corner portion of the insulating substrate 101. Thus, in the pressure process, the corner conductor 109 can be positioned such that the corner conductor 109 tends to curve convexly toward the first surface 102 in the longitudinal sectional view from the outer peripheral end of the external connection conductor 108 to the end of the corner portion of the insulating substrate 101, and such that the distance between the corner conductor 109 and the second surface 103 gradually increases in the thickness direction of the insulating substrate 101. That is, the portion where the insulator 110 is positioned to be thick before pressure pushes the metallization paste to be the corner conductor 109, deeper into the ceramic green sheet to be the insulating substrate 101, when pressurized.

It should be noted that although the above-described manufacturing method is configured such that a frame-shaped ceramic green sheet for the upper insulating layer 106 and a flat ceramic green sheet to be the lower insulating layer 107 are used for layering, the present embodiment is not limited to this method. For example, a pressure jig having a protrusion and a recess may be used to apply pressure such that a recessed cavity 104 is located on the surface of a ceramic green sheet to be an insulating substrate 101 to which a metallization paste or a ceramic paste is applied. At this time, by determining the position of the pressure jig so as to apply pressure to the bottom portion of the cavity 104, the portion where the ceramic green sheet is pushed by the protrusion of the pressure jig becomes the cavity 104, and the portion pushed by the recess of the pressurizing jig becomes the frame portion (upper insulating layer 106) surrounding the mounting region 102A. On the second surface 103 side of the ceramic green sheet, the ceramic paste to be the insulator 110 is pushed by a jig together with the metallization paste to be the external connection conductor 108, and the metallization paste to be the corner conductor 109 becomes a structure in which the metallization paste is curved convexly toward the first surface 102. Then, as a result of pressing the metallization paste to be the external connection conductor 108 with the jig, the exposed surface of the external connection conductor 108 and the second surface 103 of the insulating substrate 101 become coplanar. As the binder to be added to the ceramic green sheet, the metallization paste, or the ceramic paste, which are used, a binder having a glass transition temperature equal to or lower than a temperature when pressed by a mold can be used. By using such a binder, when the ceramic green sheet or the like is pressed by a pressure jig, it is possible to excellently perform molding such as coplanarity of the frame portion and the exposed surface of the external connection conductor 108 and the second surface 103 of the insulating substrate 101.

At this time, the width and depth of the recess of the pressure jig are constant, and the width and the height of the frame after the pressurizing process can be constant. Therefore, the dimensional accuracy can be improved by keeping the width of the frame after the pressure process constant. Then, by firing a molded body in which the lower insulating layer 107 provided with the external connection conductor 108 or the like and the upper insulating layer 106 provided with the frame-shaped metallization layer 113 or the like are integrated, a mother board 200 in which a plurality of wiring board regions 100A to be an electronic component housing package 100 are arranged, can be manufactured.

The electronic component housing package 100 of the present disclosure may further include a cover conductor 120. The cover conductor 120 is located closer to the first surface 102 than the corner conductor 109 at the corner portion of the insulating substrate 101. The cover conductor 120 covers a portion toward the first surface 102 from the corner conductor 109 at the corner portion. Since the corner portion in the side surface 105 of the insulating substrate 101 is covered with the cover conductor 120, the strength of the corner portion in the side surface 105 of the insulating substrate 101 can be enhanced, and chipping and cracking can be suppressed.

As described above, the electronic component housing package 100 is produced by dividing a multipiece wiring board (mother board 200). The mother board 200 includes a plurality of wiring board regions 100A in the vertical and horizontal directions (X direction, Y direction) of the board surface. The mother board 200 includes a dividing groove (hereinafter referred to simply as a groove) at the boundary between two adjacent wiring board regions 100A at the first surface 102 and the second surface 103, and the electronic component housing package 100 of each piece is obtained by breaking along the dividing groove. This groove can be formed by cutting the first surface 102 and the second surface 103 against the mother board 200 or against the mother board before firing, using a laser or a cutter blade. The inner surface of the groove is a cut surface 122, which is an inclined portion 111 with respect to the first surface 102 and the second surface 103. Therefore, as illustrated in FIG. 4, since the side surface 105 of the insulating substrate 101 includes the fracture surface 121 and the cut surface 122 (inclined portion 111), and the fracture surface 121 is the uneven portion 126 with many irregularities due to fracture, there is a possibility of chipping and cracking at the corner portion of the side surface of the insulating substrate 101.

As described above, of the corner portion between the two side surfaces 105 in the electronic component housing package 100 of the present disclosure, the end portion adjacent to the second surface 103 is surrounded and protected by the external connection conductor 108 and the corner conductor 109. A portion located toward the first surface 102 from the corner conductor 109 at the corner portion corresponds to the uneven portion 126 described above. When the electronic component housing package 100 includes the cover conductor 120 covering the corner portion of the insulating substrate 101, since the corner portion located at the uneven portion 126 is protected by the cover conductor 120 mainly composed of a metal, the occurrence of cracking and chipping at the corner portion of the insulating substrate 101 can be suppressed. Thus, for example, even contact with the tray when the electronic component housing package 100 is stored in the tray or the like for conveyance or chucking when the electronic component housing package 100 is conveyed, occurs, it becomes difficult to chip the corner portion of the insulating substrate 101 and foreign matter can be prevented from entering the cavity 104 due to chipping of the insulating substrate 101. The cover conductor 120, like the corner conductor 109 and other wiring conductors, is a metal sintered body mainly composed of a metal such as tungsten and molybdenum, and has excellent protective performance of the insulating substrate 101. "Mainly composed of a metal" means containing 90% or more of a metal, and in addition to the above metals, ceramic components and glass components can be included in order to enhance the sinterability or the joining properties with the insulating substrate 101. The cover conductor 120 protrudes from the corner conductor 109 toward the first surface 102.

As described above, exposed surfaces such as the corner conductor 109, the frame-shaped metallization layer 113, the connection pad 114, and the external connection conductor 108 may include plating films on their exposed surfaces. Oxidation corrosion can be prevented, and connection such as between the connection pad 114 and the electrode of the electronic component 112, or between the external connection conductor 108 and the module substrate 400 can be made easier or stronger. The plating film may be a plating layer formed by sequentially depositing a nickel plating layer having a thickness of about 1 to 20 μm and a gold plating layer having a thickness of about 0.1 to 3.0 μm.

In this way, for example, an electroplating method can be used to deposit the plating layer on each wiring board. A supply conductor for supplying a current in electroplating is arranged outside a plurality of wiring board regions 100A arranged on a mother board 200, and a connection conductor for connecting the supply conductor and the wiring board regions 100A located at the outermost periphery and a connection conductor for connecting the respective wirings over adjacent wiring board regions 100A can be arranged. With such a configuration, when a current is supplied to the supply conductor, electricity can be supplied to all of the wiring conductors of each wiring board region 100A, and the plating layers are deposited on the exposed wiring conductors of each wiring board region 100A.

In the mother board 200 for obtaining the electronic component housing package 100, the corner conductor 109 functions as the above connection conductor. In the mother board 200, the corner conductors 109 located in the adjacent wiring board regions 100A are connected to each other to form a circular shape in plane perspective view. As long as the corner conductor 109 only functions as a connection conductor, the corner conductor 109 may be a belt-like wiring conductor having a small width, but as described above, the wiring conductor has the above-described shape in order to surround and protect the corner portion (insulator 110) of the insulating substrate 101 together with the external connection conductor 108.

The cover conductor 120 may be connected to the corner conductor 109. In other words, the cover conductor 120 may extend from the corner conductor 109 toward the first surface 102. With such a configuration, the connection reliability of the above connection conductor is improved. When individual pieces of the electronic component housing package 100 are obtained from the mother board 200, there is a possibility of cutting also the corner conductor 109 by grooving using a laser or the like. When the corner conductor 109 is cut, the connection conductor is broken, and therefore, there is a possibility that a plating film is not formed on the wiring conductor. The corner conductor 109 is furthest from the second surface 103 in the vicinity of the boundary between the adjacent wiring board regions, and it is difficult for the corner conductor 109 to become disconnected when the second surface 103 is grooved. When the cover conductor 120 is connected to the corner conductor 109, the connection conductor is composed of the corner conductor 109 and the cover conductor 120. Since the cover conductor 120 is connected to the top of the dome-shaped corner conductor 109 in the mother board 200, the thickness of the central portion of the connection conductor is increased. Therefore, even when the grooving is performed from the second surface 103 of the mother board 200 to reach a depth exceeding the corner conductor 109, the cover conductor 120 is not cut and the conduction between the corner conductors 109 of the adjacent wiring board regions 100A is maintained.

As illustrated in FIGS. 6 and 7, in the second surface 103 of the mother board 200, an external connection conductor 108 is located at the corner portion of each wiring board region 100A. On the first surface 102 side of the external connection conductor 108, the circular insulator 110 is located straddling the adjacent wiring board regions 100A. The dome-shaped corner conductor 109 covering the insulator 110 is located on the first surface 102 side of the insulator 110. Further, the cover conductor 120 is located on the first surface 102 side of the corner conductor 109 in the vicinity of the boundary between the four wiring board regions 100A adjacent to each other in plane perspective.

In order to position the cover conductor 120 at the corner portion of the insulating substrate 101 in this manner, the following steps may be added to the manufacturing method described above. For example, a plurality of holes may be formed by a pressure jig or the like including a plurality of projecting portions in a region to be a corner portion of each wiring board region 100A on the second surface 103 side of a ceramic green sheet to be the lower insulating layer 107, and these holes may be filled with a metallization paste to be the cover conductor 120. A metallization paste to be the corner conductor 109 is applied thereon. The holes may be filled at the same time as applying the metallization paste to be the corner conductor 109 without filling the holes with the metallization paste to be the cover conductor 120.

In the electronic component housing package 100 of the present disclosure, the width on the first surface 102 side in the cover conductor 120 may be smaller than the width on the corner conductor 109 side. In other words, the cover conductor 120 may have a width near the first surface 102 that is smaller than a width near the second surface 103. With such a configuration, the position shift of the groove when the mother board 200 for manufacturing the electronic component housing package 100 is divided, can be easily determined by the shape of the cover conductor 120. In other words, when the cover conductor 120 has a smaller shape than the predetermined shape of the cover conductor 120, it means that the groove is deviated from the predetermined position, and when the shape of the cover conductor 120 is within a proper range, it is easily confirmed that the groove is located in the predetermined position and the size of the insulating substrate 101 is appropriate.

When, as in the example illustrated in FIG. 6, the dividing grooves formed in the second surface 103 of the mother board 200 and extending vertically and horizontally, pass through the center of the cover conductor 120 in plane perspective, then, as illustrated in FIG. 4, at the corner portion of the insulating substrate 101, the portions appearing on the two side surfaces 105 sandwiching the corner portion of the cover conductor 120 are approximately the same in shape and size. Further, the cover conductor 120 appearing on the side surface 105 of each electronic component housing package 100 obtained from the adjacent wiring board regions 100A is substantially the same in shape and size as one another. On the other hand, when the cover conductor 120 is not divided at the center, the shape and size of the cover conductor 120 appearing in each of the two side surfaces 105 sandwiching the corner portion, and the shape and size of the cover conductor 120 appearing on the side surface 105 of the electronic component housing package 100 obtained from the adjacent wiring board regions 100A are different from one another. When the groove position is greatly deviated, the cover conductor 120 is not exposed to the side surface 105. Even when the width of the cover conductor 120 on the first surface 102 side is the same as the width of the second surface 103 side, that is, the cover conductor 120 on the mother board 200 is cylindrical, the size of the portion appearing on the side surface 105 is different. On the other hand, when the width of the cover conductor 120 on the first surface 102 side is smaller than the width of the second surface 103 side, that is, when the cover conductor 120 on the mother board 200 is a conical shape with a rounded tip, the difference in shape becomes more distinguished. Therefore, the electronic component housing package 100 having a large position shift of the grooves and a large dimensional deviation can be easily selected, and the electronic component housing package 100 having excellent dimensional accuracy can be efficiently manufactured.

As described above, the side surface 105 of the insulating substrate 101 includes cut surfaces 122 and a fracture surface 121. As illustrated in FIG. 4, the fracture surface 121 is located at the center in the thickness direction of the insulating substrate 101, and the cut surfaces 122 are located on the upper side (first surface 102 side) and the lower side (second surface 103 side), respectively, across the fracture surface 121. An upper dividing line 123 is located at the boundary between the fracture surface 121 and the cut surface 122 on the upper side, and a lower dividing line 124 is located at the boundary between the fracture surface 121 and the cut surface 122 on the lower side. The upper dividing line 123 corresponds to the bottom of the groove formed in the first surface 102 of the mother board 200, and the lower dividing line 124 corresponds to the bottom of the groove formed in the second surface 103. The upper dividing line 123 extends substantially parallel to the first surface 102, and includes a portion that curves convexly toward the second surface 103 at the corner portion of the insulating substrate 101. The lower dividing line 124 extends substantially parallel to the second surface 103, and includes a portion that curves convexly toward the first surface 102 at the corner portion of the insulating substrate 101. The respective curved portions in the upper dividing line 123 and the lower dividing line 124 are depressions 125 that are deeper in the groove. When the groove is formed by a laser machining process, a portion where the groove in the X direction and the groove in the Y direction intersect each other receives laser irradiation two times in total, at the time of forming the groove in the X direction and at the time of forming the groove in the Y direction. In the portion where the groove in the X direction and the groove in the Y direction intersect, the groove becomes deeper than the other portion. Therefore, the upper dividing line 123 and the lower dividing line 124 each include a depression 125 at the corner portion of the insulating substrate 101 in the electronic component housing package 100.

In the case where the depression 125 of the upper dividing line 123 is deep, when the cover conductor 120 is exposed to the depression 125 in plan view from the first surface 102 in the mother board 200 state, it can be confirmed that the groove is formed at a predetermined position. When the width of the cover conductor 120 on the first surface 102 side is smaller than the width on the second surface 103 side, the position of the groove can be determined with higher accuracy.

In the electronic component housing package 100 of the present disclosure, the side surface 105 includes an inclined portion 111 located near the second surface 103 and an uneven portion 126 extending in the thickness direction of the insulating substrate 101 from the inclined portion 111, and the cover conductor 120 may be located at the uneven portion 126. Such a configuration reduces, for example, the likelihood that solder joined to the external connection conductor 108 and the brazing material 118 or the like when joining the lid 116 may be short-circuited through the cover conductor 120. "The cover conductor 120 is located at the uneven portion 126" means that the cover conductor 120 is located at the fracture surface 121. This means that the cover conductor 120 is not exposed on the outer surface of the mother board 200 for manufacturing the electronic component housing package 100. Therefore, a metal layer (plating film) formed on the surface of the wiring conductor or the like exposed on the surface in the state of the mother board 200 is not formed on the surface of the cover conductor 120. Therefore, in the electronic component housing package 100 obtained by singulating the mother board 200, the metal layer (plating layer) is not located on the surface of the cover conductor 120 located between the external connection conductor 108 and the frame-shaped metallization layer 113 to which the lid 116 is connected. Therefore, it is difficult for solder, when joining the external connection conductor 108 to the module substrate 400, and the brazing material 118, when joining the lid 116, to be joined to the cover conductor 120, and the likelihood of short-circuiting between the external connection conductor 108 and the frame-shaped metallization layer 113 via the cover conductor 120 is reduced. The inclined portion 111 is located between the uneven portion 126 and the second surface 103 at the side surface 105, and is adjacent to the second surface 103. The angle between the inclined portion 111 and the second surface 103 is greater than a right angle (90 degrees). As a result, the distance along the side surface 105 from the external connection conductor 108 of the second surface 103 to the cover conductor 120, and further to the frame-shaped metallization layer 113 of the first surface 102, becomes longer than in the case where the angle between the second surface 103 and the side surface 105 is a right angle. In other words, including the inclined portion 111 further reduces the likelihood of the above-described short circuit. When the inclined portion 111 is also located between the first surface 102 and the uneven portion 126, the distance from the external connection conductor 108 to the frame-shaped metallization layer 113 along the side surface 105 is further increased, further reducing the likelihood of a short circuit between them.

An electronic device 300 of the present disclosure includes the electronic component housing package 100 described above and an electronic component 112 mounted on the electronic component housing package 100. With such a configuration, chipping and cracking of the electronic component housing package 100 during handling are suppressed, and an electronic device 300 with excellent dimensional accuracy can be provided. In other words, an electronic device with excellent dimensional accuracy can be manufactured by using the electronic component housing package 100 in which chipping and cracking of the corner portion on the second surface 103 side of the insulating substrate 101 in the electronic component housing package 100 are suppressed. In addition, the likelihood of disconnection of the conduction path such as the through-hole conductor 117 due to cracking, chipping, or the like, and the likelihood of separation of the external connection conductor 108 from the insulating substrate 101 are reduced, and an electronic device excellent in electrical connection reliability between the electronic component housing package 100 and the module substrate 400 can be achieved.

The electronic component 112 may include, for example, a piezoelectric element such as: a ceramic piezoelectric element or a surface acoustic wave element; a semiconductor element; a capacitative element; a resistive element; or the like, in addition to a piezoelectric oscillator such as a crystal oscillation element of a temperature compensated crystal oscillator (TCXO).

Each electrode (not illustrated) of the electronic component 112 is connected to the connection pad 114 via a joining material 115 such as a conductive adhesive, as illustrated in FIGS. 8 and 9.

The electronic module 500 of the present disclosure includes the electronic device 300 described above and a module substrate 400 to which the electronic device 300 is connected. Due to the high joining strength of the external connection conductor 108 of the electronic component housing package 100, the reliability of the electrical connection between the electronic device 300 and the module substrate 400 is high, thereby providing the electronic module 500 with excellent operation reliability.

It should be noted that the present disclosure is not limited to one example of the above-described embodiment, and various modifications are possible as long as they do not deviate from the gist of the present disclosure. For example, the electronic component housing package 100 may include one recessed cavity 104 on the first surface 102 side, but may include a plurality of cavities, each including a mounting region. Further, as connection pads 114, although a pair of rectangular pads to which the electronic component is connected, are positioned in the cavity 104, pads in other shapes or numbers depending on the shape, type, or the like of the mounted electronic component may be positioned. In addition, although four rectangular external connection conductors 108 are located at the corner portions of the second surface 103, the present embodiment is not limited thereto, and the external connection conductors 108 other than those located at the four locations may have a shape other than a rectangular shape and may be located at positions other than the corner portions, depending on the size of the electronic component housing package 100, the type of the electronic device, the electronic component to be mounted, or the like.

Although the insulating substrate 101 of the electronic component housing package 100 has been described as having a shape including a cavity 104, it may be a flat insulating substrate 101 as illustrated in FIG. 9. In this case, the first surface 102 of the insulating substrate 101 also includes the mounting region 102A on which the electronic component 112 is mounted. The lid 116 in this case is, for example, a box shape that covers the mounting region 102A and can accommodate the electronic component 112 therein. As illustrated in FIG. 9, the electronic component 112 may be mounted in the mounting region 102A of the electronic component housing package 100, the electronic component 112 may be covered with a box-shaped (hat-shaped) lid 116 having a brim, and the electronic device 300 may be formed by joining the brim of the lid 116 and the outer peripheral part of the first surface 102 of the insulating substrate 101 by a joining material. Although the insulating substrate 101 in the electronic component housing package 100 in FIG. 9 is composed of one insulating layer, a plurality of insulating layers may be layered.

REFERENCE SIGNS LIST

100 Electronic component housing package
100A Wiring board region
101 Insulating substrate
102 First surface
102A Mounting region
103 Second surface
104 Cavity
105 Side surface
106 Upper insulating layer
107 Lower insulating layer
108 External connection conductor
109 Corner conductor
110 Insulator
111 Inclined portion
112 Electronic component
113 Frame-shaped metallization layer
114 Connection pad
115 Joining material
116 Lid
117 Through-hole conductor
118 Brazing material
120 Cover conductor
121 Fracture surface
122 Cut surface
123 Upper dividing line
124 Lower dividing line
125 Depression
126 Uneven portion
200 Mother board
300 Electronic device
400 Module substrate
500 Electronic module

The invention claimed is:

1. An electronic component housing package, comprising:
an insulating substrate comprising a first surface with a mounting region mounting an electronic component, a second surface located opposite to the first surface, a plurality of side surfaces located between the first surface and the second surface, and a corner portion located between two of the side surfaces;
an external connection conductor intersecting an intersection of a respective side surface among the plurality of the surfaces and the second surface in a plan view; and
a corner conductor connected to the external connection conductor, wherein the corner conductor forms an arch in a side view,
wherein the external connection conductor and the corner conductor sandwich therebetween, in a thickness direction of the insulating substrate, a corner of the insulating substrate between the second surface and the two of the side surfaces.

2. An electronic device, comprising:
the electronic component housing package according to claim 1; and
an electronic component mounted in the electronic component housing package.

3. An electronic module, comprising:
the electronic device according to claim 2; and
a module substrate connected to the electronic device.

4. The electronic component housing package according to claim 1, wherein:
the external connection conductor is located at the corner portion of the second surface; and
two adjacent sides of the external connection conductor overlap with two sides of the second surface.

5. An electronic component housing package, comprising:
an insulating substrate comprising a first surface with a mounting region mounting an electronic component, a second surface located opposite to the first surface, a plurality of side surfaces located between the first surface and the second surface, and a corner portion located between two of the side surfaces;
an external connection conductor intersecting an intersection of a respective side surface among the plurality of the surfaces and the second surface in a plan view; and
a corner conductor connected to the external connection conductor, wherein the corner conductor forms an arch in a side view; and
a cover conductor that protrudes from the corner conductor toward the first surface.

6. The electronic component housing package according to claim 5, further comprising:
the cover conductor is located closer to the first surface than the corner conductor at the corner portion.

7. The electronic component housing package according to claim 5, wherein
the cover conductor is electrically coupled to the corner conductor.

8. The electronic component housing package according to claim 6, wherein
the cover conductor has a width near the first surface smaller than a width near the second surface.

9. The electronic component housing package according to claim 6, wherein
the plurality of side surfaces each comprises an inclined portion located near the second surface and an uneven portion extending from the inclined portion in a thickness direction of the insulating substrate, and the cover conductor is located adjacent to the uneven portion.

10. An electronic device, comprising:
the electronic component housing package according to claim 5; and
an electronic component mounted in the electronic component housing package.

11. An electronic module, comprising:
the electronic device according to claim 10; and
a module substrate connected to the electronic device.

12. The electronic component housing package according to claim 1, further comprising:
a cover conductor that protrudes from the corner conductor toward the first surface.

13. The electronic component housing package according to claim 1, wherein the corner conductor has a ¼ dome shape which is concave with respect to the intersection.

14. The electronic component housing package according to claim 5, wherein the corner conductor has a ¼ dome shape which is concave with respect to the intersection.

15. The electronic component housing package according to claim 12, further comprising: the cover conductor is located closer to the first surface than the corner conductor at the corner portion.

16. The electronic component housing package according to claim 12, wherein the cover conductor is electrically coupled to the corner conductor.

17. The electronic component housing package according to claim 15, wherein the cover conductor has a width near the first surface smaller than a width near the second surface.

18. The electronic component housing package according to claim 15, wherein the plurality of side surfaces each comprises an inclined portion located near the second surface and an uneven portion extending from the inclined portion in a thickness direction of the insulating substrate, and the cover conductor is located adjacent to the uneven portion.

\* \* \* \* \*